US008981759B2

(12) United States Patent
Heishi et al.

(10) Patent No.: US 8,981,759 B2
(45) Date of Patent: Mar. 17, 2015

(54) MULTIMETER

(71) Applicant: HIOKI E.E. Corporation, Ueda-shi, Nagano (JP)

(72) Inventors: Toshio Heishi, Ueda (JP); Yoshiyuki Miyazawa, Ueda (JP)

(73) Assignee: Hioki E.E. Corporation, Ueda (JP)

( * ) Notice: Subject to any disclaimer, the term of this patent is extended or adjusted under 35 U.S.C. 154(b) by 138 days.

(21) Appl. No.: 13/929,072

(22) Filed: Jun. 27, 2013

(65) Prior Publication Data
US 2014/0002059 A1    Jan. 2, 2014

(30) Foreign Application Priority Data

Jun. 28, 2012   (JP) .................................. 2012-145706

(51) Int. Cl.
| G01R 15/08 | (2006.01) |
| G01R 1/00 | (2006.01) |
| G01R 1/38 | (2006.01) |
| G01R 1/04 | (2006.01) |
| G01R 15/00 | (2006.01) |
| G01R 15/12 | (2006.01) |

(52) U.S. Cl.
CPC .. *G01R 1/38* (2013.01); *G01R 1/04* (2013.01); *G01R 15/002* (2013.01); *G01R 15/12* (2013.01)
USPC .......................................... 324/115; 324/114

(58) Field of Classification Search
None
See application file for complete search history.

(56) References Cited

U.S. PATENT DOCUMENTS

| 5,166,599 | A | * | 11/1992 | Hochreuther et al. | ......... 324/115 |
| 5,243,275 | A | * | 9/1993 | Nakazawa et al. | ............ 324/110 |
| 5,442,337 | A | * | 8/1995 | Hwang | ......................... 340/635 |
| 5,619,129 | A | | 4/1997 | Kamiya | |
| 7,439,725 | B2 | * | 10/2008 | Fischer et al. | ................ 324/115 |

FOREIGN PATENT DOCUMENTS

JP    B2-3522030    4/2004

* cited by examiner

*Primary Examiner* — Minh N Tang
(74) *Attorney, Agent, or Firm* — Oliff PLC

(57) ABSTRACT

A multimeter includes: a rotary switch which selects a measurement function; a common terminal hole into which a connector of a test probe is inserted; selection terminal holes into which the connector of the test probe is selectively inserted; and shutter plates which selectively open the selection terminal holes. The rotary switch includes convex portions. The shutter plate includes a hole corresponding to the common terminal hole so that the shutter plate rotates by using the center of the common terminal hole as the rotation axis and includes a concave portion engageable with the convex portion so that the shutter plate rotates to open the selection terminal holes by the movement of the convex portion. The shutter plate includes a concave portion engageable with the convex portion so that the shutter plate opens and closes the selection terminal hole by the movement of the convex portion.

4 Claims, 6 Drawing Sheets

MULTIMETER

BACKGROUND

1. Technical Field

The present invention relates to a multimeter in which a plurality of selection terminal holes for inserting a connector of a test probe thereinto is selectively opened in accordance with a rotation of a rotary switch for selecting a measurement function.

2. Background of the Invention

A multimeter (called a tester) which is a measurement unit with a plurality of measurement functions for measuring a voltage, a current, a resistance, and the like is used in various measurement sites. The multimeter includes a common terminal hole into which a black test probe is inserted and a plurality of selection terminal holes into which a connector of a red test probe is inserted. Then, a measurer selects a desired measurement function by rotating a rotary switch and performs a measurement by inserting the red test probe into the selection terminal hole corresponding to the selected measurement function and inserting the black test probe into the common terminal hole.

In a case where the measurer uses the multimeter by inserting the test probe into the erroneous selection terminal hole, a circuit or a fuse inside the multimeter may be damaged. For example, a maximum current that may flow to the current measurement selection terminal hole is defined. Accordingly, when the current measurement selection terminal hole is used by mistake for the other measurement function, there is a case in which the fuse may be damaged due to the excessive current flowing thereto. For this reason, for example, as disclosed in Japanese Patent No. 3522030, there is known a multimeter with an erroneous insertion preventing mechanism in which a shutter plate is moved by a rotation of a rotary switch so as to open a selection terminal hole corresponding to a measurement function.

SUMMARY OF THE INVENTION

In the multimeter illustrated in FIG. 1 of Japanese Patent No. 3522030, the rotation of the rotary switch is transmitted to the shutter plate through a follower and a gear mechanism, so that the structure becomes complex and the wide space is needed. In the multimeter illustrated in FIG. 12 of the same patent document, the structure is simple since the follower and the like is not used. However, since a shutter plate is rotated so that a round hole formed in the shutter plate matches a selection terminal hole, the shutter plate larger than the round hole is needed, and the wide space is needed in consideration of the structure.

There are problems as below. That is, the multimeter needs to be decreased in size so as to improve the portability of the multimeter or the erroneous insertion preventing mechanism such as the shutter plate needs to be provided in a saved space so as to cope with the complex internal circuit due to the advanced function or to improve the design.

The invention is made to solve the above-described problems, and it is an object of the present invention to provide a multimeter with an erroneous insertion preventing mechanism such as a shutter plate saving a space and having a simple structure.

The invention has been made in order to achieve the above object, and according to a first aspect of the invention, there is provided a multimeter including: a rotary switch which selects a measurement function; a common terminal hole into which a connector of a test probe is inserted; a plurality of selection terminal holes into which a connector of the other test probe is selectively inserted; and a shutter plate which is driven by the rotation of the rotary switch and selectively opens the selection terminal holes, wherein the rotary switch includes a first convex portion and a second convex portion which move along with the rotation thereof, a first shutter plate and a second shutter plate are provided as the shutter plate, the first shutter plate includes a hole corresponding to the common terminal hole so that the first shutter plate rotates by using a center of the common terminal hole as a rotation axis and includes a first concave portion engageable with the first convex portion so that the first shutter plate rotates in a reciprocating manner so as to open any one of a first selection terminal hole and a second selection terminal hole by the movement of the first convex portion, and the second shutter plate includes a second concave portion engageable with the second convex portion so that the second shutter plate rotates in a reciprocating manner so as to open and close a third selection terminal hole by the movement of the second convex portion.

According to the first aspect of the invention, the second shutter plate may be formed in a shape in which the second shutter plate shields the second selection terminal hole while opening the third selection terminal hole.

According to the first aspect of the invention, the multimeter further includes a position holding mechanism which holds the respective positions of the first shutter plate and the second shutter plate.

The multimeter of the invention may save the space by the simple structures of the first and second shutter plates and the like. Particularly, when the second shutter plate is formed in a shape in which the second shutter plate opens and closes not only the third selection terminal hole but also the second selection terminal hole, it is possible to open any one of the first to third selection terminal holes with a simple structure. Since the position holding mechanisms for the first and second shutter plates are provided, it is possible to reliably hold the opening and closing states of the selection terminal hole even when there is an influence of an external force such as a vibration.

DETAILED DESCRIPTION

Hereinafter, embodiments of the invention will be described in detail, but the scope of the invention is not limited thereto.

Figure 1:
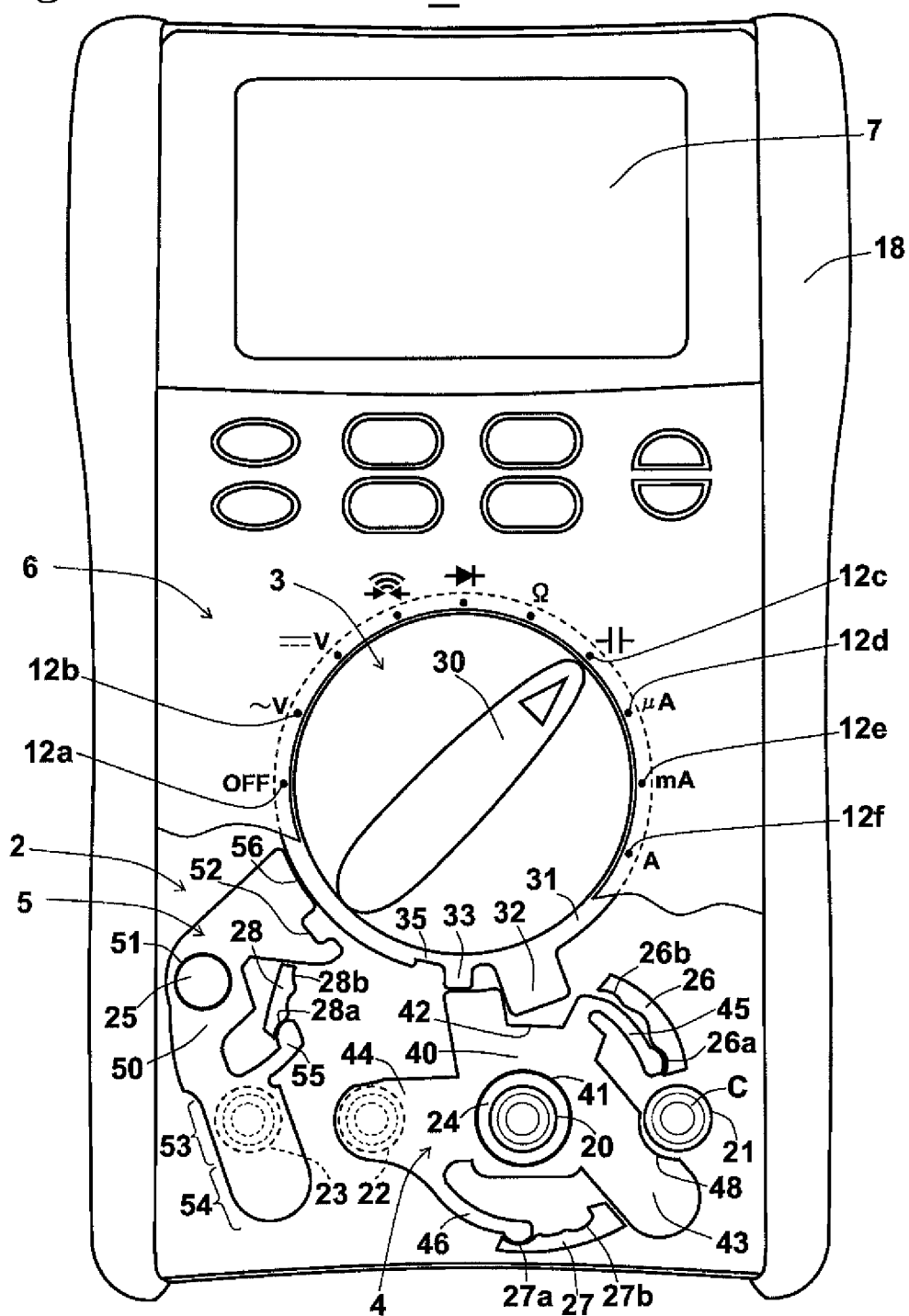
FIG. 1 is a partially cutaway front view illustrating an outline of a structure of a multimeter according to the invention.

A multimeter 1 according to the invention is illustrated in FIG. 1. The multimeter 1 is an example of a portable digital multimeter, and includes a casing box 2, a rotary switch 3, a first shutter plate 4, a second shutter plate 5, a decorative panel 6, a common terminal hole 20, a first selection terminal hole 21, a second selection terminal hole 22, a third selection terminal hole 23, and a display panel 7 which displays a measurement result thereon.

The rotary switch 3, the first shutter plate 4, and the second shutter plate 5 are attached to the front surface side of the casing box 2 (the observation surface side of the drawing), and the base portion of the rotary switch 3 (a flange portion 31 and outer peripheral convex portions 32 and 33, and a notch portion 35) and shutter plates 4 and 5 are covered by the decorative panel 6 so as to be hidden therein. In the same drawing, a part of the decorative panel 6 is cut and illustrated in order to understand the structures of the shutter plates 4 and 5 and the rotary switch 3 that becomes an erroneous insertion preventing mechanism.

The casing box 2 is an insulated resinous hollow casing that is formed in a size in which a measurer may hold the casing box by one hand. In the same drawing, an example is illustrated in which an impact protection cushion member 18 is attached to both sides of the casing box 2. Although not illustrated in the drawings, for example, the casing box 2 may be divided into two boxes, that is, upper and lower boxes, and a measurement electric circuit board and a battery is disposed inside the casing.

The casing box 2 is provided with a common terminal hole 20 for inserting a connector (not illustrated) of a test probe thereinto and is also provided with a first selection terminal hole 21, a second selection terminal hole 22, and a third selection terminal hole 23 for selectively inserting a connector (not illustrated) of another test probe thereinto. In this example, the selection terminal hole 21, the common terminal hole 20, the selection terminal hole 22, and the selection terminal hole 23 are arranged at the same interval in series (in a linear shape) in this order from the right side of the drawing. A connector C to be connected to the test probe is disposed inside the common terminal hole 20 and the selection terminal holes 21, 22, and 23.

In the casing box 2, a cylindrical wall 24 which becomes the rotation shaft of the shutter plate 4, position holding walls 26 and 27 of the shutter plate 4, a column 25 which becomes the rotation shaft of the shutter plate 5, and a position holding wall 28 of the shutter plate 5 are formed of a resin so as to be integrated with the casing box 2 while protruding toward the front surface side of the casing box 2.

The cylindrical wall 24 is formed in the hole edge of the common terminal hole 20 so as to be coaxial with the center of the common terminal hole 20. That is, the inner wall of the cylindrical wall 24 becomes the common terminal hole 20. The side wall of the position holding wall 26 is provided with circular-arc recess portions 26a and 26b, and the side wall of the position holding wall 27 is provided with circular-arc recess portions 27a and 27b. The column 25 is formed in the vicinity of the selection terminal hole 23 so as to be positioned at the space near the rotary switch 3. The side wall of the position holding wall 28 is provided with circular-arc recess portions 28a and 28b.

The rotary switch 3 is used to select the measurement function. The measurement function is selected at the position of a front end of a knob 30 of the rotary switch 3. In this example, the rotary switch 3 also serves as a power switch. As illustrated in the same drawing, as an example, the rotary switch 3 may select an AC voltage measurement function (position 12b), a DC voltage measurement function, a conduction measurement function, a diode polarity measurement function, a resistance measurement function, a capacitance measurement function (position 12c), a μA-level current measurement function (position 12d), a mA-level current measurement function (position 12e), and an A-level current measurement function (position 12f) in a clockwise rotation order from a power-off position 12a. In this example, the selection positions are disposed so that the respective measurement functions are changed whenever rotating the rotary switch 3 by 22.5°. Further, a rotation range regulation mechanism (not illustrated) which regulates the rotation range is provided so that the rotary switch 3 may rotate within the range of the power-off position 12a to the A-level current measurement function position 12f.

By the measurement function selected by the rotary switch 3, the selection terminal hole 21 is used in the AC voltage measurement function (position 12b) to the capacitance measurement function (position 12c). The selection terminal hole 22 is used at the μA-level current measurement function (position 12d) and the mA-level current measurement function (position 12e). The selection terminal hole 23 is used at the A-level current measurement function (position 12f). Although not illustrated in the drawings, even the decorative panel 6 is provided with the selection terminal holes 21 to 23 and the common terminal hole 20, a character, a symbol, a mark, and the like representing the corresponding measurement functions are displayed at the positions near the selection terminal holes 21 to 23, and a character and the like (for example, "COM") representing the common terminal is displayed at the position near the common terminal hole 20.

In this way, in the multimeter 1, the selection positions of the measurement functions are sequentially arranged so as to select the group of the measurement functions (the AC voltage measurement function to the capacitance measurement function) other than the current measurement function commonly using the selection terminal hole 21 from the start end side (the side of the position 12a (b)) of the rotation range of the rotary switch 3. Then, the selection terminal hole 21 is disposed at one side of the common terminal hole 20 (at the right side of the drawing as an example). Further, the selection positions are arranged in an order toward the end side of the rotation range while the A-level current measurement function is disposed at the end so as to select the group of the current measurement functions (the μA-level current measurement function, the mA-level current measurement function, and the A-level current measurement function) at the end side of the rotation range of the rotary switch 3. Then, the selection terminal hole 22 is disposed at the other side of the common terminal hole 20 (the left side of the drawing as an example), and the selection terminal hole 23 is further disposed at the side thereof.

The base portion of the rotary switch 3 is provided with the disk-like flange portion 31. The flange portion 31 is integrally formed with the rotary switch 3 so that the disk becomes coaxial with the rotation axis of the rotary switch 3. The plate thickness of the disk of the flange portion 31 is set to be equal to or thicker than the plate thicknesses of the shutter plates 4 and 5. The shutter plate 5 slides on the side surface (circular-arc wall) of the flange portion 31 as described below.

Further, the flange portion 31 is integrated with the first convex portion 32 and the second convex portion 33 which protrude outward in the radial direction of the disk. The convex portion 32 and the convex portion 33 are formed with a predetermined gap therebetween in the circumferential direction of the flange portion 31 so that the convex portion 32 is positioned near the shutter plate 4 and the convex portion 33 is positioned near the shutter plate 5. Furthermore, the convex portion 32 protrudes outward further in the radial direction of the disk in relation to the convex portion 33, so that the protrusion amounts thereof are set to be different from each other. The convex portion 32 is formed in the flange portion 31 (rotary switch 3) so that the convex portion may engage with a concave portion 42 of the shutter plate 4 to be described later when the function changes from the measurement function (position 12c) other than the current measurement function to the current measurement function (position 12d) and the function changes from the current measurement function (position 12d) to the measurement function (position 12c) other than the current measurement function. Further, the convex portion 33 is formed in the flange portion 31 so that the convex portion may engage with a concave portion 52 of the shutter plate 5 to be described later when the function changes from the mA-level current measurement function (position 12e) to the A-level current measurement function (position 12f) and the function changes from the A-level current measurement function (position 12f) to the mA-level current measurement function (position 12e).

Further, the flange portion 31 is provided with the notch portion 35 which is provided at the side of the shutter plate 5 of the convex portion 33 (the opposite side of the convex portion 32). The notch portion 35 is provided so as to ensure a clearance that does not disturb the rotation of the shutter plate 5. The notch portion 35 is formed in a shape that is obtained by notching at least the range in which the flange portion 31 is pressed against a circular-arc wall 56 during the rotation of the shutter plate 5.

The shutter plate 4 is formed as one plate which is flat as a whole by integrally forming the first shield arm 43 and the second shield arm 44 with the base plate 40. The shield arm 43 is used to open and close the selection terminal hole 21, and the shield arm 44 is used to open and close the selection terminal hole 22.

The base plate 40 includes a hole 41 which corresponds to the common terminal hole 20. The hole 41 is formed in a size in which the hole is exactly fitted to the cylindrical wall 24 of the casing box 2 and slides on the cylindrical wall 24. Since the hole 41 is fitted to the cylindrical wall 24, the base plate 40 may rotate in a reciprocating manner by using the center of the common terminal hole 20 as the rotation axis.

Figure 2:
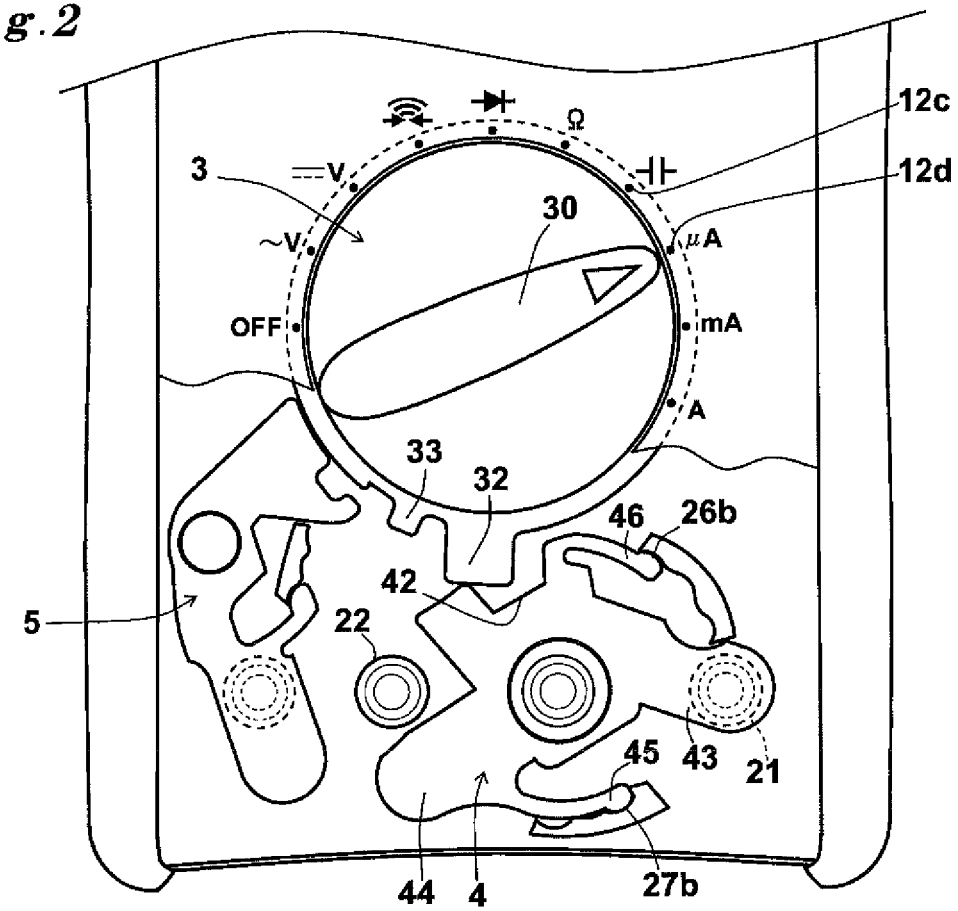
FIG. 2 is a front view illustrating a main part for describing a movement of a shutter plate illustrated in FIG. 1.

The base plate 40 is provided with the first concave portion 42 which may engage with the convex portion 32 of the rotary switch 3. The base plate 40 is formed in a size in which the base plate does not engage with the convex portion 33 of the rotary switch 3. By the movement of the convex portion 32 through the normal rotation and the reverse rotation of the rotary switch 3, the convex portion 32 engages with the concave portion 42 so that the base plate 40 may rotate in a reciprocating manner. The convex portion 32, the base plate 40, the concave portion 42, and the shield arms 43 and 44 are formed by satisfying a relation in which the base plate 40 rotates in a reciprocating manner so that the shutter plate 4 moves like a seesaw and becomes any position among a first position in which the shield arm 43 opens the selection terminal hole 21 and the shield arm 44 shields (closes) the selection terminal hole 22 as illustrated in FIG. 1 and a second position in which the shield arm 43 shields the selection terminal hole 21 and the shield arm 44 opens the selection terminal hole 22 as illustrated in FIG. 2.

In this example, as illustrated in FIG. 1, the hole 41 is substantially formed at the center of the base plate 40, the shield arm 43 is formed at one side of the base plate 40, and the shield arm 44 is formed at the other side thereof. The shield arm 43 and the shield arm 44 are formed in the base plate 40 so as to have a predetermined angle therebetween. It is desirable that the shield arms 43 and 44 be formed in at least a size and a shape in which the shield arms may shield the selection terminal holes 21 and 22. Further, for example, a circular-arc notch portion 48 is formed in the shield arm 43 so that the selection terminal hole 21 is completely opened. In this way, the angles, the shapes, and the like of the shield arms 43 and 44 are determined in consideration of the rotation angle of the shutter plate 4 and the positions of the selection terminal holes 21 and 22.

Furthermore, as illustrated in FIG. 1, the shutter plate 4 is integrally provided with elastic arms 45 and 46 which flexibly slide on the position holding walls 26 and 27. The pair of the position holding wall 26 and the elastic arm 45 and the pair of the position holding wall 27 and the elastic arm 46 respectively become the position holding mechanisms of the shutter plate 4. At the first position, it is possible to hold the position in which the circular-arc front end of the elastic arm 45 is fitted to the recess portion 26a and the circular-arc front end of the elastic arm 46 is fitted to the recess portion 27a. At the second position, it is possible to hold the position in which the front end of the elastic arm 45 is fitted to the recess portion 26b and the front end of the elastic arm 46 is fitted to the recess portion 27b. In order to satisfy such a positional relation, the elastic arms 45 and 46 and the position holding walls 26 and 27 are formed.

The shutter plate 5 is formed as one plate which is flat as a whole by integrally forming a third shield arm 53 and a fourth shield arm 54 with the base plate 50. The shield arm 53 is used to open and close the selection terminal hole 23, and the shield arm 54 is used to open and close the selection terminal hole 22. As illustrated in FIG. 1, since the extension portion obtained by extending the front side of the shield arm 53 becomes the shield arm 54, the structure and the shape become simple. This configuration is desirable in that the space may be further saved. Furthermore, the shield arm 53 and the shield arm 54 may be provided as separate arms.

The base plate 50 is provided with a hole 51 that is formed in a size in which the hole is exactly fitted to the column 25 and slides on the column 25. Since the hole 51 is fitted to the column 25, the base plate 50 may rotate in a reciprocating manner by using the column 25 as the rotation axis.

The base plate 50 is provided with the second concave portion 52 which may engage with the convex portion 33 of the rotary switch 3. The concave portion 52 is formed at one side of the hole 51 (the upper side of the drawing) and the shield arms 53 and 54 are formed at the other side of the hole 51 (the lower side of the drawing).

Figure 4:
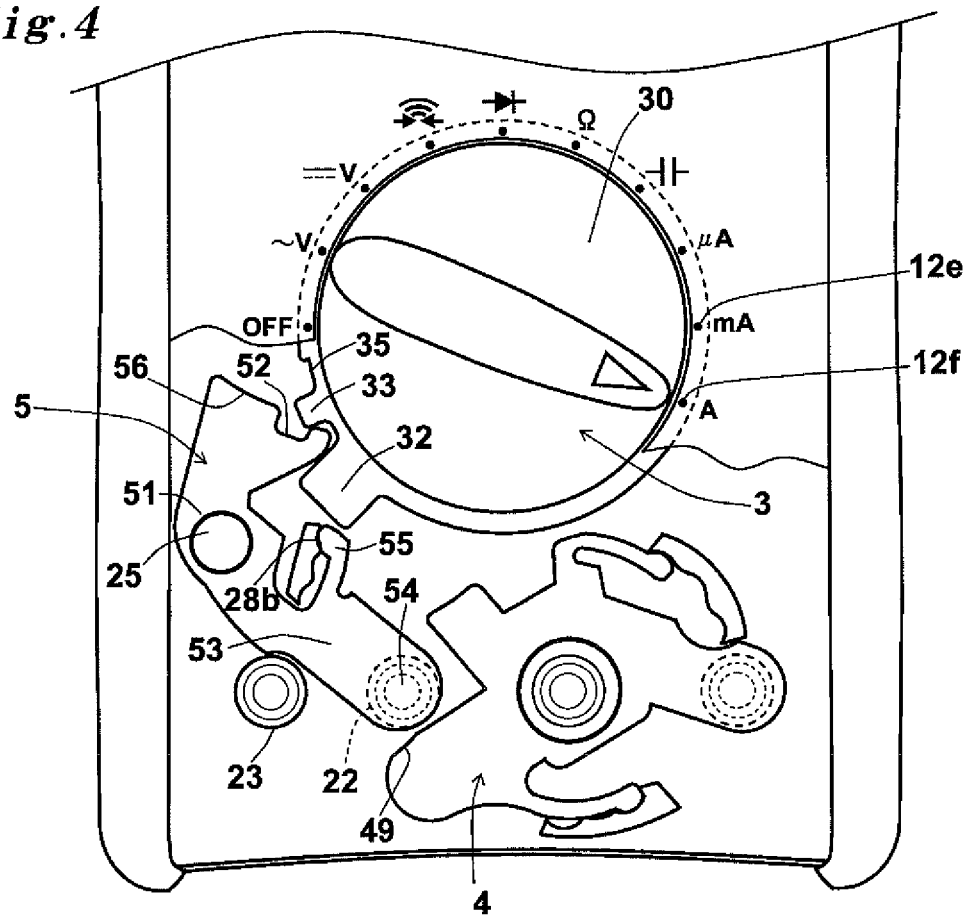
FIG. 4 is a front view illustrating a main part for describing the movement of the shutter plate illustrated in FIG. 1.

By the movement of the convex portion 33 through the normal rotation and the reverse rotation of the rotary switch 3, the convex portion 33 engages with the concave portion 52 so that the base plate 50 may rotate in a reciprocating manner. The convex portion 33, the base plate 50, the concave portion 52, and the shield arms 53 and 54 are formed by satisfying a relation in which the base plate 50 rotates in a reciprocating manner so that the shutter plate 5 moves like a seesaw and becomes any position among a third position in which the shield arm 53 shields the selection terminal hole 23 and the shield arm 54 opens the selection terminal hole 22 as illustrated in FIG. 1 and a fourth position in which the shield arm 53 opens the selection terminal hole 23 and the shield arm 54 shields the selection terminal hole 22 as illustrated in FIG. 4. For example, as illustrated in FIG. 4, the shutter plate 4 is provided with a circular-arc notch portion 49 so that the shutter plate 4 does not interfere with the shutter plate 5 during the rotation of the shutter plate 5.

As illustrated in FIG. 1, the shutter plate 5 is integrally formed with an elastic arm 55 which flexibly slides on the position holding wall 28. The pair of the position holding wall 28 and the elastic arm 55 becomes the position holding mechanism of the shutter plate 5. The elastic arm 55 and the position holding wall 28 are formed so as to satisfy a relation in which the circular-arc front end of the elastic arm 55 is fitted and held to the recess portion 28a at the third position and the front end of the elastic arm 55 is fitted and held to the recess portion 28b at the fourth position.

Furthermore, the base plate 50 of the shutter plate 5 is provided with the circular-arc wall 56 (another example of the position holding mechanism) which is formed with substantially the same circular-arc diameter as that of the flange portion 31 and slides on the flange portion 31. The circular-arc wall 56 is formed in the base plate 50 so that the shutter plate 5 becomes coaxial with the rotary switch 3 (flange portion 31) at the third position illustrated in FIG. 1. The circular-arc wall 56 is formed in the base plate 50 so as to at least slightly cross the virtual line (not illustrated) connecting the rotation center of the rotary switch 3 and the center of the column 25 at the third position.

Since the casing box 2, the rotary switch 3, and the shutter plates 4 and 5 slide on each other, it is desirable to mold these members by, for example, modified polyphenylene ether (m-PPE) with good sliding property and durability. Since the m-PPE also has elasticity (flexibility), the m-PPE may be desirably used in the shutter plates 4 and 5 with the elastic arms 45 and 46 and the elastic arm 55.

Hereinafter, an operation of the multimeter 1 will be described in detail by referring to FIGS. 1 to 4.

When a measurer rotates the rotary switch 3 by holding the knob 30 illustrated in FIG. 1, both the convex portion 32 and the convex portion 33 also move so as to go around the outer periphery of the rotary switch 3.

When the rotary switch 3 (knob 30) rotates in the range from the power-off position (position 12a) to the capacitance measurement function (position 12c), the convex portion 32 does not engage with the concave portion 42 of the shutter plate 4 and the convex portion 33 does not engage with the concave portion 52 of the shutter plate 5. Accordingly, the shutter plates 4 and 5 do not move. For this reason, the shutter plate 4 is held at the first position in which the shield arm 43 opens the selection terminal hole 21 and the shield arm 44 shields the selection terminal hole 22 as illustrated in FIG. 1, and the shutter plate 5 is held at the third position in which the shield arm 53 shields the selection terminal hole 23 and the shield arm 54 opens the selection terminal hole 22.

The shutter plate 4 does not move by a vibration or the like so that its position is reliably held because the elastic arms 45 and 46 are held by the position holding walls 26 and 27 (two pairs of position holding mechanisms). Furthermore, the position may be held by one pair of position holding mechanisms. The shutter plate 5 does not move by a vibration or the like because the elastic arm 55 is held by the position holding wall 28. Further, since the end of the circular-arc wall 56 near the concave portion 52 is pressed against the flange portion 31 even when an external force is applied to the shutter plate 5 so as to rotate the shutter plate, the rotation of the shutter plate 5 is prevented and hence the shutter plate is further held at the third position.

When the rotary switch 3 is rotated in the clockwise direction from the position at the capacitance measurement function (position 12c) illustrated in FIG. 1 to the μA-level current measurement function (position 12d), the convex portion 32 engages with the concave portion 42. Since the convex portion 32 moves along with the rotation of the rotary switch 3 and presses the inner wall of the engaged concave portion 42 in the rotation direction, the shutter plate 4 rotates about the cylindrical wall 24 (common terminal hole 20). When the μA-level current measurement function (position 12d) is selected by the rotation of the shutter plate 4 as illustrated in FIG. 2, the shutter plate 4 becomes the second position at which the shield arm 43 shields the selection terminal hole 21 and the shield arm 44 opens the selection terminal hole 22. The shutter plate 4 is held at the second position by the elastic arms 45 and 46 and the position holding walls 26 and 27.

Since the protrusion amount of the convex portion 33 is small, the convex portion 33 does not influence the rotation of the shutter plate 4.

Figure 3:
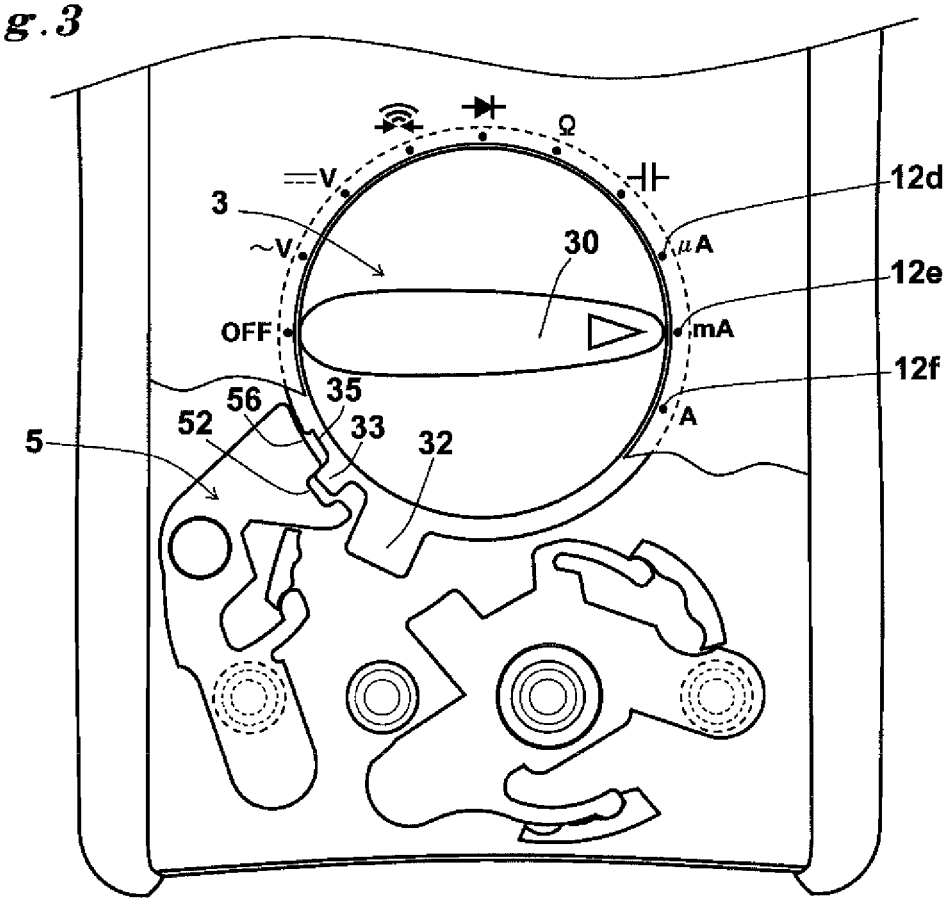
FIG. 3 is a front view illustrating a main part for describing the movement of the shutter plate illustrated in FIG. 1.

Even when the rotary switch 3 is rotated from the state of the position of the μA-level current measurement function (position 12d) illustrated in FIG. 2 to the mA-level current measurement function (position 12e) as illustrated in FIG. 3, the convex portion 33 does not engage with the concave portion 52 and does not press the concave portion 52. Accordingly, the shutter plate 5 does not move. For this reason, the shutter plate 5 is held at the second position.

Since the convex portion 33 engages with the concave portion 52 in a pressing state when rotating the rotary switch 3 from the state of the position of the mA-level current measurement function (position 12e) illustrated in FIG. 3 to the A-level current measurement function (position 12f) as illustrated in FIG. 4, the shutter plate 5 is pressed and rotated. By the rotation, the shutter plate 5 becomes the fourth position in which the shield arm 53 opens the selection terminal hole 23 and the shield arm 54 shields the selection terminal hole 22. Since the elastic arm 55 is held by the position holding wall 28, the shutter plate 5 is held at the fourth position and does not move by a vibration or the like. Furthermore, the convex portion 32 may engage with the shutter plate 5 in a pressing state along with the convex portion 33 so that the shutter plate 5 rotates.

When the shutter plate 5 rotates from the state of FIG. 3 to the state of FIG. 4, the end of the circular-arc wall 56 near the concave portion 52 passes through the notch portion 35 without being pressed against the flange portion 31. For this reason, the shutter plate 5 smoothly rotates without disturbing the rotation thereof.

The common terminal hole 20 is opened in any state of FIGS. 1 to 4.

When the rotary switch 3 is rotated reversely from the state of the position of the A-level current measurement function (position 12f) illustrated in FIG. 4 to the mA-level current measurement function (position 12e) as illustrated in FIG. 3, the convex portion 33 engages with the concave portion 52 in a pressing state. Accordingly, the shutter plate 5 rotates and becomes the third position illustrated in FIG. 3.

When the rotary switch 3 is rotated from the state of the position of the μA-level current measurement function (position 12d) illustrated in FIG. 2 to the capacitance measurement function (position 12c) as illustrated in FIG. 1, the convex portion 32 engages with the concave portion 42 in a pressing state. Accordingly, the shutter plate 4 rotates and becomes the first position illustrated in FIG. 1.

In this way, the shutter plate 4 rotates in a reciprocating manner by the movement of the convex portion 32 provided in the rotary switch 3 and the shutter plate 5 rotates in a reciprocating manner by the movement of the convex portion 33, so that any one of the selection terminal holes 21 to 23 is selectively opened in response to the position of the rotary switch 3. Accordingly, the configurations of the convex portions 32 and 33 and the shutter plates 4 and 5 are simple and the space necessary for the arrangement of these members is saved.

Next, another multimeter 1a according to the invention will be described.

Figure 5:
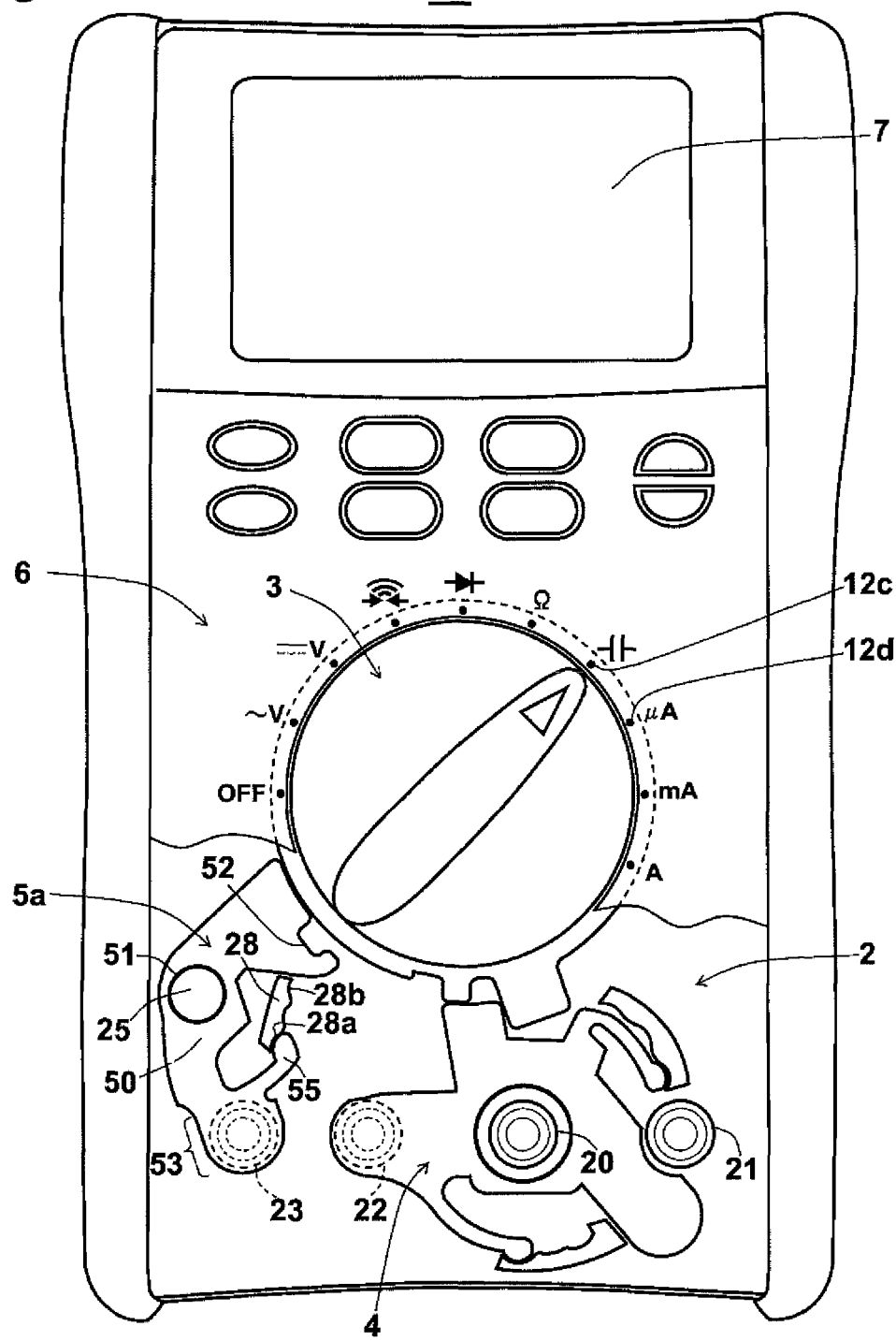
FIG. 5 is a front view illustrating an outline of a structure by notching a part of another multimeter according to the invention.

The multimeter 1a illustrated in FIG. 5 is different from the multimeter 1 in that a shutter plate 5a which includes only the shield arm 53 but does not include the shield arm 54 is provided. The other configurations of the multimeter 1a are the same as those of the multimeter 1.

Figure 6:
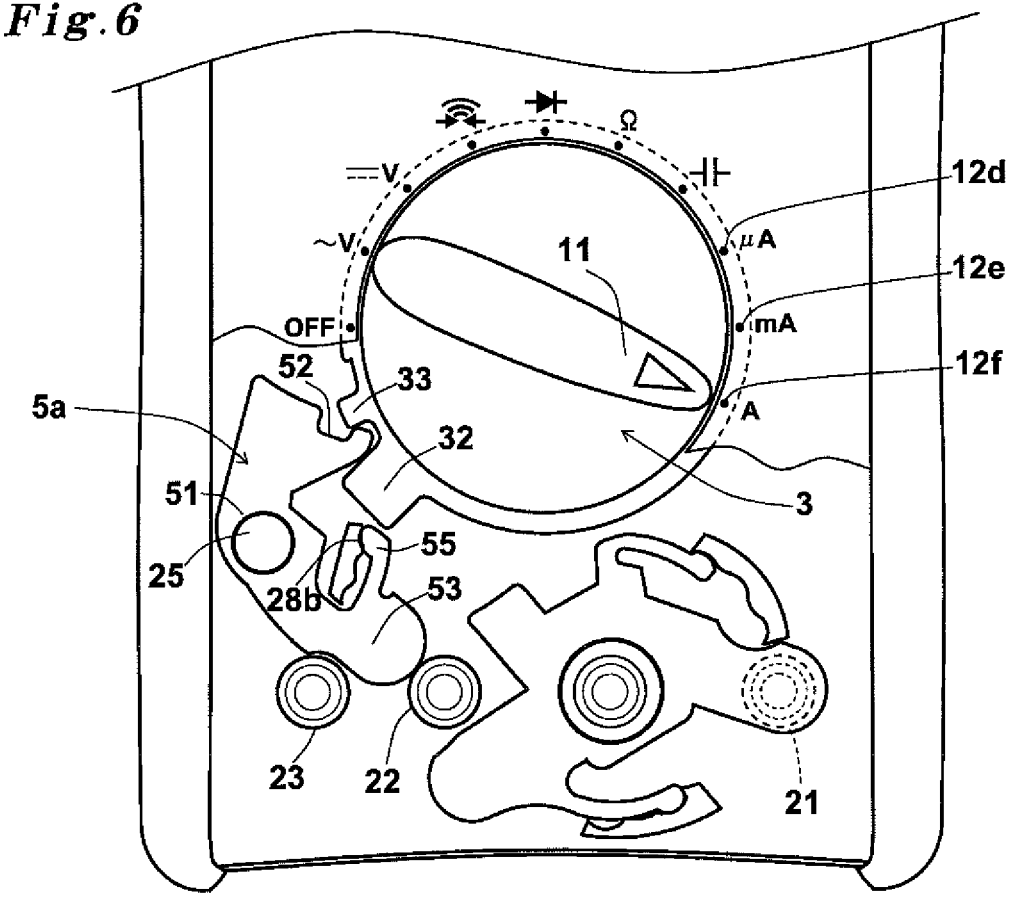
FIG. 6 is a front view illustrating a main part for describing a movement of a shutter plate illustrated in FIG. 5.

Since the multimeter 1a does not include the shield arm 54, the selection terminal hole 22 and the selection terminal hole 23 are opened when the rotary switch 3 is positioned at the A-level current measurement function (position 12f) as illustrated in FIG. 6. When the rotary switch 3 is positioned at the other measurement functions, any one of the selection terminal holes 21 and 22 is opened as in the multimeter 1.

As in the multimeter 1, it is desirable to open any one of the selection terminal holes 21 to 23. However, the configuration may be simplified so that two selection terminal holes 22 and 23 are opened at the specific measurement function as in the multimeter 1a.

While the multimeters 1 and 1a of the invention have been described, the position holding mechanisms of the shutter plates 4 and 5 are not limited to the above-described examples, and may be formed as a claw or a protrusion for the holding operation. Further, various existing position holding mechanisms may be provided. Further, a structure may be added which clearly changes the position.

Further, an example has been described in which the selection terminal hole 21 used for the voltage measurement function and the like is disposed at the right side of the common terminal hole 20 and the selection terminal holes 22 and 23 used for the current measurement function are disposed at the left side of the common terminal hole 20. However, a reverse arrangement may be employed so that the selection terminal hole 21 is disposed at the left side of the common terminal hole 20 and the selection terminal holes 22 and 23 are disposed at the right side of the common terminal hole 20. In this case, the positions of the convex portions 32 and 33, the positions and the shapes of the shutter plates 4 and 5, the shapes and the angles of the shield arms 43 and 44, the shapes and the angles of the shield arms 53 and 54, and the like are appropriately changed in response to the positions and the opening and closing states of the respective terminal holes 20 to 23.

Further, an example has been described in which the shield arm 43 shields one selection terminal hole 21. However, a configuration may be employed in which a different selection terminal hole is further provided at the right side of the selection terminal hole 21 of FIG. 1 and the different selection terminal hole is shielded by the shield arm 43 along with the selection terminal hole 21. Further, an example is illustrated in which the respective terminal holes 20 to 23 are arranged in a linear shape. However, the respective terminal holes may be arranged in a curve shape as long as the respective terminal holes may be opened and closed by the shield arms 43, 44, 53, and 54 of which the shapes are appropriately changed, and the arrangement may be arbitrarily set.

An example has been described in which the shutter plates 4 and 5 are formed as one flat plate, but a configuration may be employed in which the base plates 40 and 50 are formed as thick plates and the shield arms 43 and 44 and the shield arms 53 and 54 are formed as thin plates. The shapes, the plate thicknesses, and the like of the shutter plates 4 and 5 may be appropriately changed. Further, an example has been described in which the cylindrical wall 24 for the rotation shaft is formed in the casing box 2, but a configuration may be employed in which the rear surface side of the base plate 40 is provided with the cylindrical wall and the cylindrical wall is fitted to the common terminal hole 20 so that the base plate 40 may rotate. In this way, the configurations of the rotation shafts of the base plates 40 and 50 may be appropriately changed.

What is claimed is:

1. A multimeter comprising:
a rotary switch which selects a measurement function;
a common terminal hole into which a connector of a test probe is inserted;
a plurality of selection terminal holes into which a connector of the other test probe is selectively inserted; and
a shutter plate which is driven by the rotation of the rotary switch and selectively opens the selection terminal holes,
wherein the rotary switch includes a first convex portion and a second convex portion which move along with the rotation thereof,
a first shutter plate and a second shutter plate are provided as the shutter plate,
the first shutter plate includes a hole corresponding to the common terminal hole so that the first shutter plate rotates by using a center of the common terminal hole as a rotation axis and includes a first concave portion engageable with the first convex portion so that the first shutter plate rotates in a reciprocating manner so as to open any one of a first selection terminal hole and a second selection terminal hole by the movement of the first convex portion, and
the second shutter plate includes a second concave portion engageable with the second convex portion so that the second shutter plate rotates in a reciprocating manner so as to open and close a third selection terminal hole by the movement of the second convex portion.

2. The multimeter according to claim 1,
wherein the second shutter plate is formed in a shape in which the second shutter plate shields the second selection terminal hole while opening the third selection terminal hole.

3. The multimeter according to claim 1, further comprising a position holding mechanism which holds the respective positions of the first shutter plate and the second shutter plate.

4. The multimeter according to claim 2, further comprising a position holding mechanism which holds the respective positions of the first shutter plate and the second shutter plate.

* * * * *